(12) United States Patent
Moon et al.

(10) Patent No.: US 7,009,230 B2
(45) Date of Patent: Mar. 7, 2006

(54) BARRIER STACK WITH IMPROVED BARRIER PROPERTIES

(75) Inventors: Bum Ki Moon, Tokyo (JP); Gerhard Beitel, Kanagawa (JP); Nicolas Nagel, Kanagawa (JP); Andreas Hilliger, Kanagawa (JP); Koji Yamakawa, Kanagawa (JP); Keitaro Imai, Kanagawa (JP)

(73) Assignees: Infineon Technologies Aktiengesellschaft, Munich (DE); Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/604,323

(22) Filed: Jul. 10, 2003

(65) Prior Publication Data

US 2004/0178431 A1    Sep. 16, 2004

Related U.S. Application Data

(63) Continuation-in-part of application No. 10/050,246, filed on Jan. 15, 2002, now Pat. No. 6,787,831.

(51) Int. Cl.
*H01L 29/76* (2006.01)
(52) U.S. Cl. .................. 257/295; 257/306; 257/309
(58) Field of Classification Search ........ 257/295–310; 438/3, 253–254
See application file for complete search history.

(56) References Cited

U.S. PATENT DOCUMENTS

| | | | |
|---|---|---|---|
| 5,510,651 A | 4/1996 | Maniar et al. | |
| 5,838,035 A | 11/1998 | Ramesh | |
| 5,892,254 A | 4/1999 | Park et al. | |
| 6,090,658 A | 7/2000 | Joo | |
| 6,117,689 A | 9/2000 | Summerfelt | |
| 6,153,490 A | 11/2000 | Xing et al. | |
| 6,288,420 B1 | 9/2001 | Zhang et al. | |
| 6,292,352 B1 * | 9/2001 | Yamamichi | ................. 257/295 |
| 6,303,433 B1 * | 10/2001 | Kuo | ............................ 438/254 |
| 6,313,539 B1 * | 11/2001 | Yokoyama et al. | ......... 257/295 |
| 6,319,765 B1 | 11/2001 | Cho et al. | |
| 6,339,007 B1 | 1/2002 | Wang et al. | ................ 438/393 |

FOREIGN PATENT DOCUMENTS

| | | |
|---|---|---|
| EP | 0 821 415 A2 | 1/1998 |
| EP | 0 821 415 A3 | 2/1998 |
| EP | 1 035 588 A2 | 9/2000 |
| EP | 1 054 441 A2 | 11/2000 |
| EP | 1 035 588 A3 | 3/2002 |
| EP | 1 054 441 A3 | 1/2003 |

* cited by examiner

*Primary Examiner*—Cuong Nguyen
(74) *Attorney, Agent, or Firm*—Horizon IP Pte Ltd (57) ABSTRACT

An improved barrier stack for inhibiting diffusion of atoms or molecules, such as $O_2$ is disclosed. The barrier stack is particularly useful in capacitor over plug structures to prevent plug oxidation which can adversely impact the reliability of the structures. The barrier stack includes first and second barrier layers. In one embodiment, the first barrier layer comprises first and second sub-barrier layers having mismatched grain boundaries. The sub-barrier layers are selected from, for example, Ir, Ru, Pd, Rh, or alloys thereof. By providing mismatched grain boundaries, the interface of the sub-barrier layers block the diffusion path of oxygen. To further enhance the barrier properties, the first barrier layer is passivated with $O_2$ using, for example, a rapid thermal oxidation. The RTO forms a thin oxide layer on the surface of the first barrier layer. The oxide layer can advantageously promote mismatching of the grain boundaries of the first and second sub-barrier layer. The second barrier layer comprises a conductive oxide.

28 Claims, 11 Drawing Sheets

BARRIER STACK WITH IMPROVED BARRIER PROPERTIES

CROSS REFERENCE TO RELATED APPLICATIONS

This application is a continuation-in-part of patent application entitled "Barrier Stack with Improved Barrier Properties", U.S. Ser. No. 10/050,246, which is herein incorporated by reference for all purposes.

BACKGROUND OF INVENTION

Figure 1:
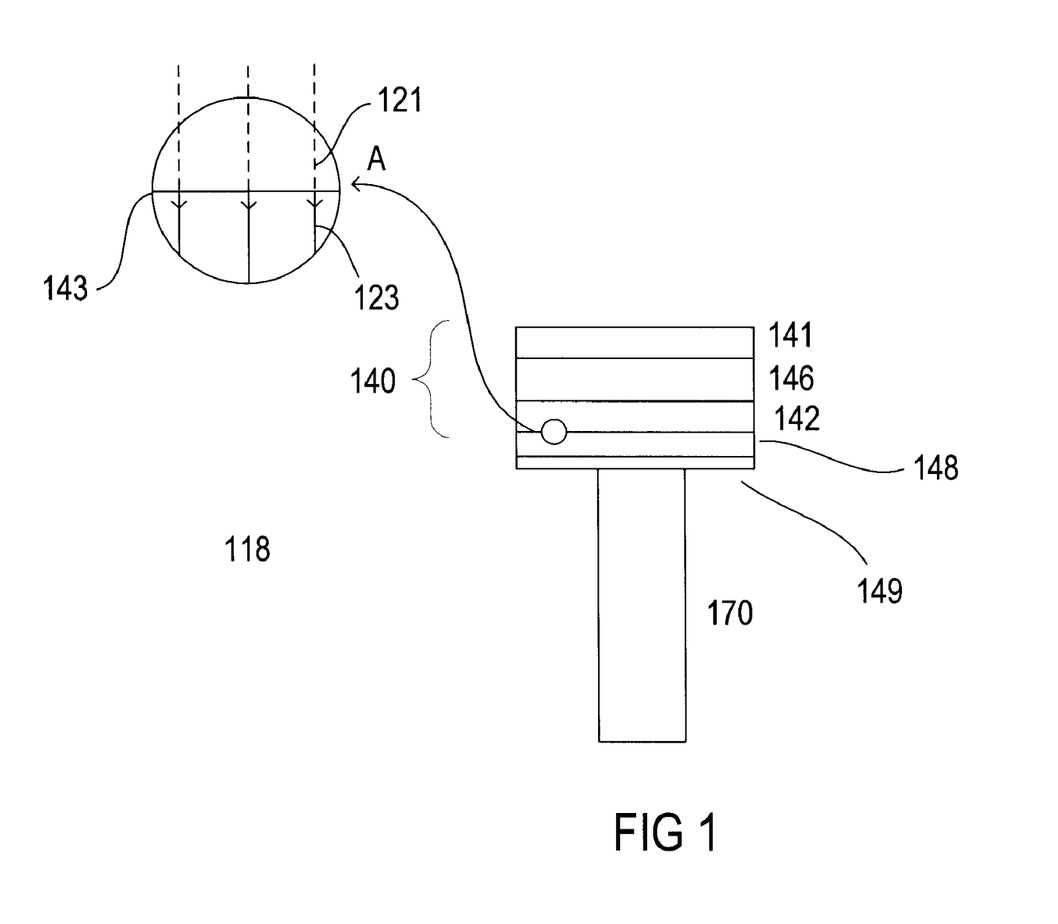
FIG. 1 shows a capacitor on plug structure.

Memory ICs comprise a plurality of memory cells interconnected by bitlines and wordlines. A memory cell includes a transistor coupled to a capacitor for storage of a bit of information. To realize high density memory ICs, the memory cells employ a capacitor over plug structure (COP), as shown in FIG. 1. The structure includes a capacitor 140 having a dielectric layer 146 located between first and second electrodes 141 and 142. The capacitor is coupled to a conductive plug 170.

Typically, a high temperature anneal in an oxygen ($O_2$) ambient is required to improve the properties of the dielectric layer, particularly for high K dielectric and ferroelectric materials. During the anneal, $O_2$ diffuses through the capacitor and oxidizes the plug. This can lead to performance degradation and, in some cases, failure as a result of increased plug resisitivity or electrical open connections.

To prevent diffusion of oxygen through the capacitor, a barrier layer 148 formed from iridium is provided between the lower electrode and the plug. An adhesion layer 149 is provided to promote adhesion between the barrier layer and interlevel dielectric layer 118, such as silicon dioxide ($SiO_2$) or silicon nitride (SiN). Iridium is used due to its good barrier properties against $O_2$. In conventional processing, the barrier layer and electrode have vertical grain boundaries 121 and 123 which connect at the interface 143, as shown in caption A. The connection of the vertical grain boundaries of the layers provides diffusion paths for $O_2$. At high temperatures (e.g., >600° C.), $O_2$ can easily diffuse through the grain boundaries of the barrier layer to oxidize the adhesion layer and the plug.

Figure 2:
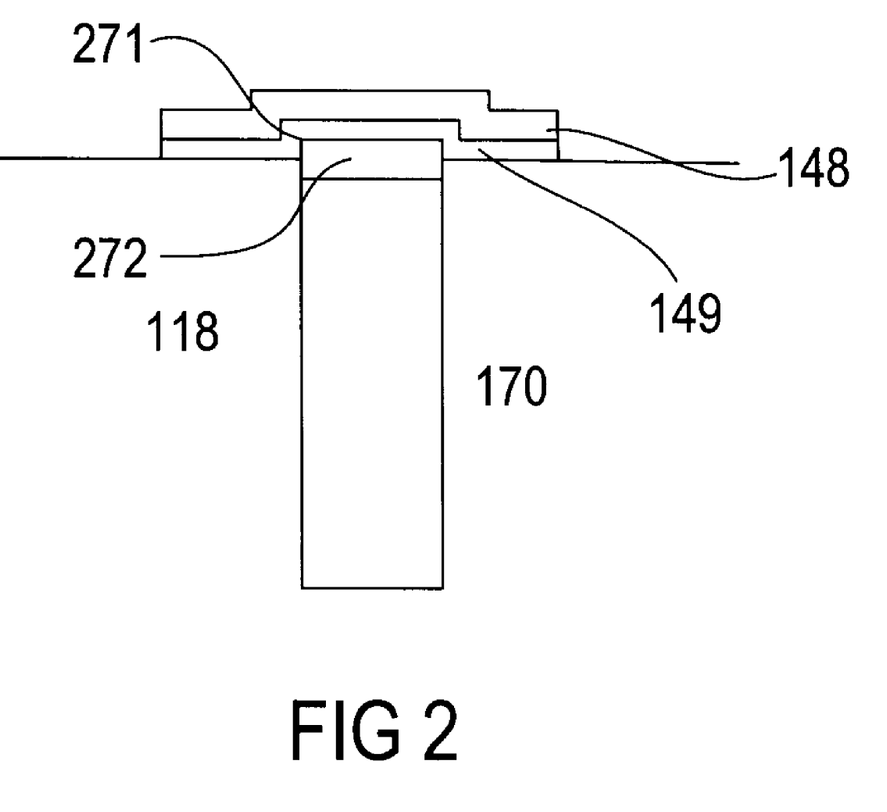
FIG. 2 shows a capacitor on plug structure with a step above the plug.

Also, in some applications, the upper surface of the plug 170 is above the upper surface of the dielectric layer 118, creating a step 271, as shown in FIG. 2. For example, the step is created due to the formation of a silicide layer 272 above the plug when polysilicon is used to form plug. The step has been found to undesirably degrade the structural properties of the barrier layer near the corner of the step, allowing oxygen to diffuse through the barrier layer and oxidizing the plug.

Figure 3:
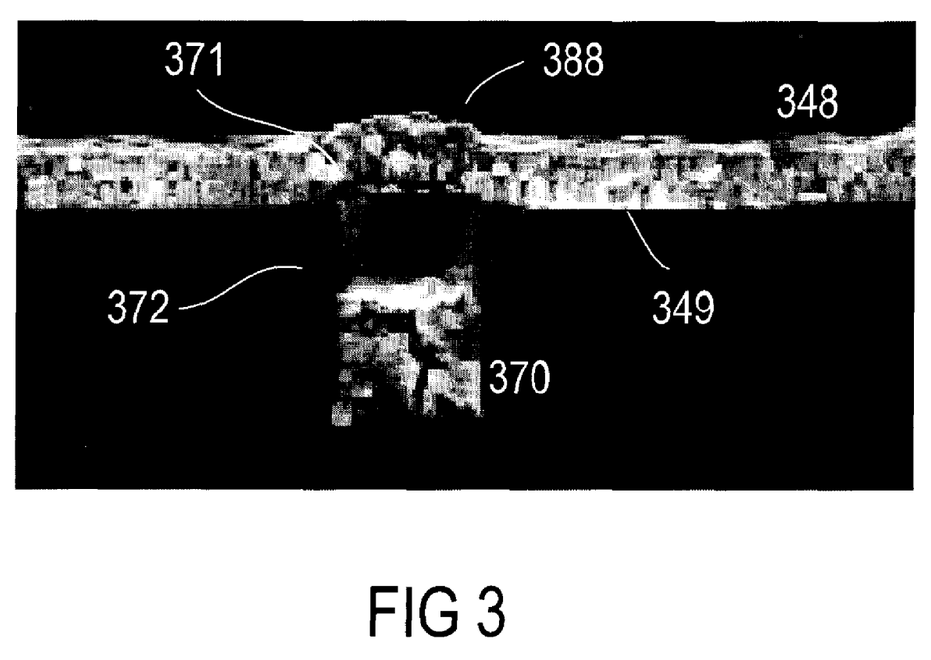
FIG. 3 shows a TEM of a capacitor on plug structure.

FIG. 3 shows a TEM of a conventional barrier layer 348 formed over a plug 370 with a step 371 of about 30 nm in height after being subjected to an anneal of about 650° C. in an $O_2$ ambient for about 2 hours. An adhesion layer 349 comprising titanium is located beneath the barrier layer. As can be seen from the Figure, a top portion 372 of the plug is oxidized. The oxidization expands the plug, creating a bulge 388 which degrades the contact between the barrier layer and the plug. This results in high contact resistance, which can lead to performance degradation and/or failures.

From the foregoing discussion, it is desirable to provide an improved barrier layer for reducing oxidation of the plug in a capacitor over plug structure.

SUMMARY OF INVENTION

The invention relates to effective barriers against diffusion of atoms or molecules, such as $O_2$. The barrier, in one embodiment, comprises a barrier stack having a first and second barrier layer. The first barrier layer comprises a conductive barrier layer while the second barrier layer comprises a conductive oxide to enhance the barrier properties of the barrier stack. In one embodiment, the first barrier layer comprises first and second sub-barrier layers. The sub-barrier layers comprise Ir, Ru, Pd, Rh, Hf or alloys thereof. The second barrier layer comprises oxides of Ir, Ru, Pd, Rh, Hf or alloys thereof. In one embodiment, an RTO is preformed after the formation of the first sub-barrier layer to create mismatch grain boundary between it and the second sub-barrier layer. An RTO can also be performed after the formation of the second sub-barrier layer.

DETAILED DESCRIPTION

The invention relates to barrier stacks which prevent or reduce diffusion of elements, such as oxygen. Such barrier stacks can be employed in, for example, ferroelectric capacitor on plug structure to reduce plug oxidation. The barrier stack can also be employed in other types of capacitors, such as high k or non-high k dielectric capacitors. Such capacitors can be used to form random access memory cells.

Figure 4:
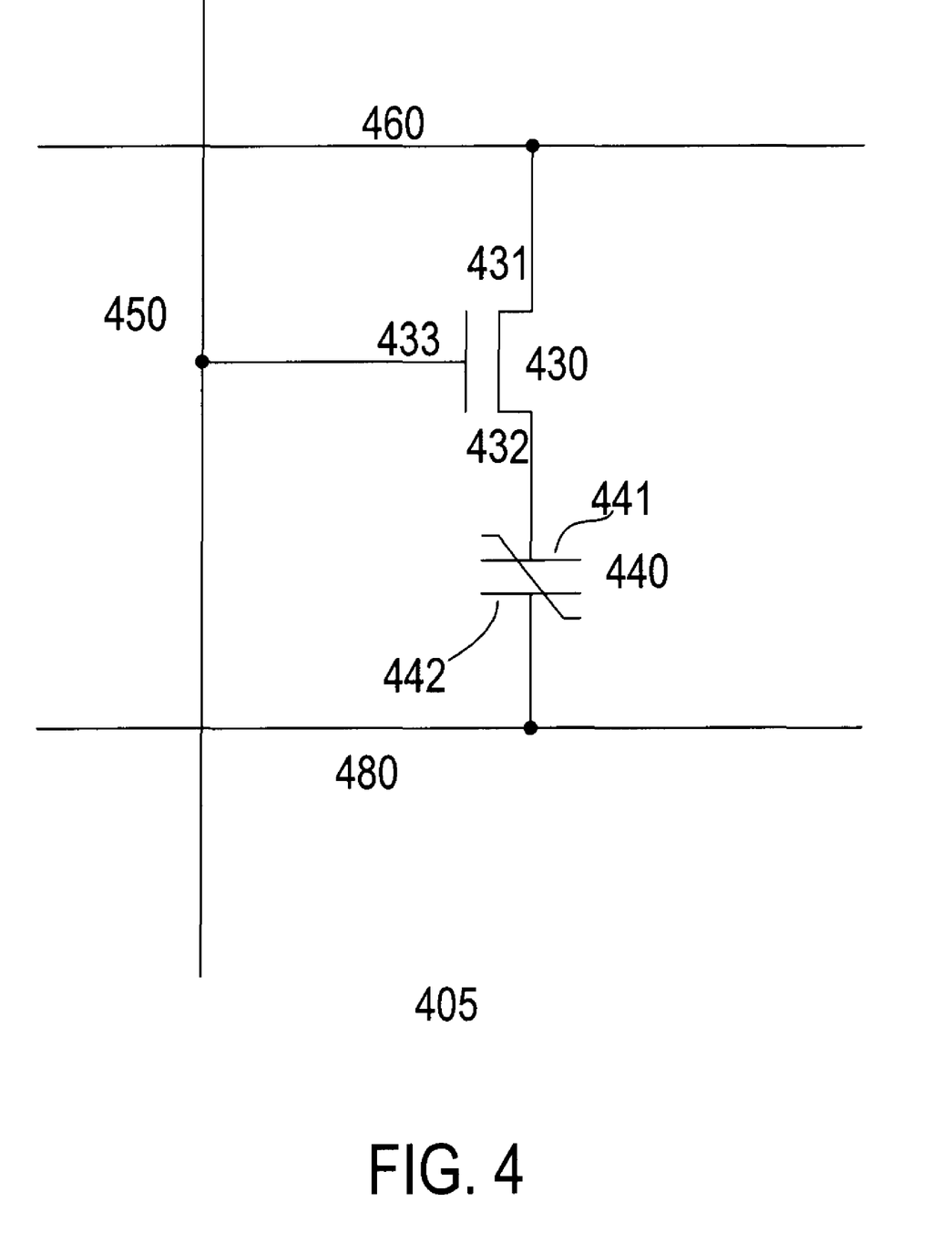
FIG. 4 shows a ferroelectric memory cell.

FIG. 4 shows a ferroelectric memory cell 405 with a transistor 430 and a capacitor 440. A second terminal 432 of the transistor is coupled to a first terminal 441 of the capacitor. Gate 433 and first terminal 431 of the transistor are respectively coupled to a wordline 450 and bitline 460. Coupled to a second terminal 442 of the capacitor is a plateline 480. The capacitor uses the hysteresis polarization characteristic of the ferroelectric material for storing information. The logic value stored in the memory cell depends on the polarization of the capacitor. To change the polarization, a voltage which is greater than the switching voltage (coercive voltage) needs to be applied across the capacitor's electrodes via the bitline and plateline. The polarization of the capacitor depends on the polarity of the voltage applied. An advantage of the ferroelectric capacitor is that it retains its polarization state after power is removed, resulting in a non-volatile memory cell.

A plurality of ferroelectric memory cells can be interconnected by wordlines and bitlines to form a memory array. Interconnecting other types of memory cells, such as dynamic memory cells, is also useful. The memory array can include a plurality of memory blocks or subarrays. In one embodiment, the memory cells can be configured in a folded bitline architecture. Other types of architectures, such as series, open or open-folded, are also useful.

Figure 5:
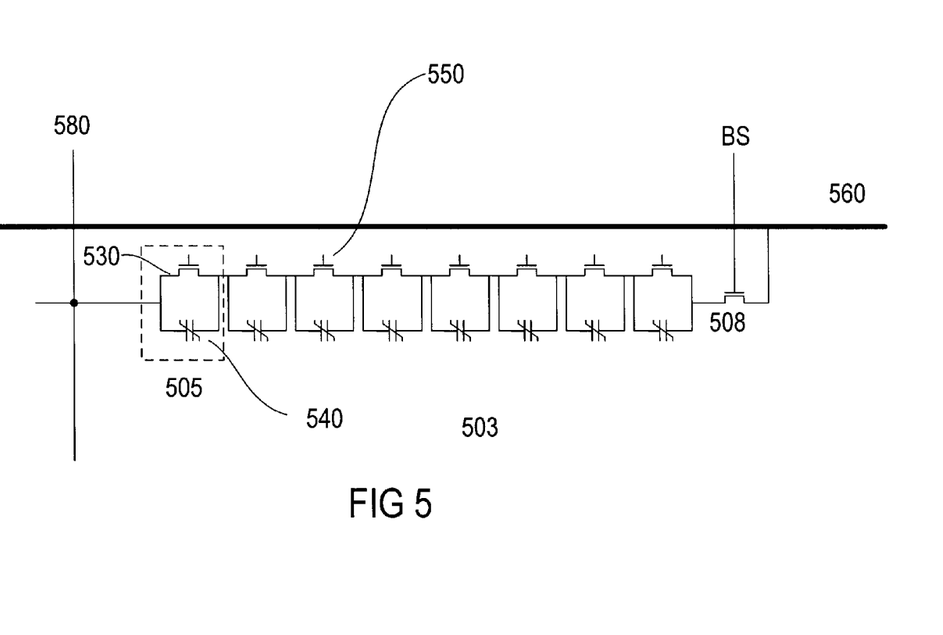
FIG. 5 shows a group of memory cells arranged in a series architecture.

FIG. 5 shows a group 503 of memory cells 505 arranged in a series architecture. Series memory architectures are described in, for example, U.S. Pat. No. 5,903,492, which is herein incorporated by reference for all purposes. As shown, the group of memory cells, each having a capacitor 540 coupled to a transistor 530 in parallel, are coupled in series. One end of the group can be selectively coupled to a bitline 560 via, for example, select transistor 508. The other end of the group is coupled to a plateline 580 while the gates of the cell transistors serve as or are wordlines 550. A plurality of such groups are interconnected by wordlines and bitlines to form a memory block or array.

Figure 6:
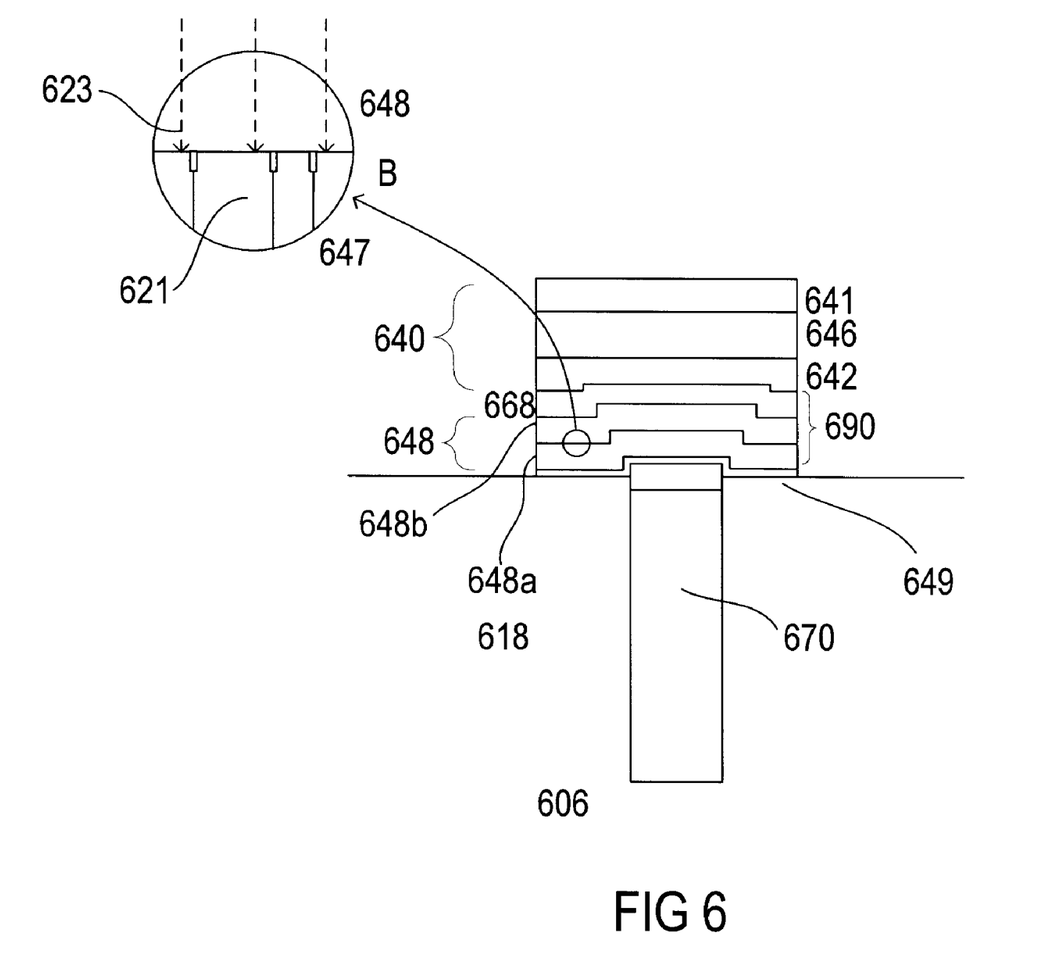
FIG. 6 shows a barrier stack in accordance with one embodiment of the invention.

FIG. 6 shows a barrier stack in accordance with one embodiment of the invention. In one embodiment, the barrier stack is employed in a capacitor over plug structure 606 to prevent or reduce plug oxidation. The barrier stack can also be used in other types of applications where diffusion of oxygen or other elements is a concern.

The capacitor on plug structure comprises a capacitor 640. In one embodiment, the capacitor comprises a dielectric layer 646 between first and second electrodes (top and bottom) 641 and 642. For a ferroelectric capacitor, the dielectric layer comprises a ferroelectric material, such as lead zirconium titanate (PZT). Strontium bismuth tantalate (SBT) or other types of ferroelectric materials are also useful. The electrodes, for example, comprise a noble metal such as platinum. Other types of conductive materials, for example, $SrRuO_3$, $La_{0.5}Sr_{0.5}O_3$, $LaNiO_3$, or $YBa_2Cu_3O_7$, are also useful. The upper and lower electrodes can be formed from the same or different materials. Other types of dielectric and electrode materials can also be useful. For example, non-ferroelectric materials can also be used to form the dielectric layer, such as high k or non-high k materials, to form non-ferroelectric capacitors.

A conductive plug 670 is electrically coupled to the capacitor. In one embodiment, the conductive plug is coupled to the bottom electrode of the capacitor. The plug is formed from a conductive material such as polysilicon (poly-Si) or tungsten (W). When poly-Si is used, a metal silicide layer can be formed on the surface of the plug. Other conductive materials are also useful. For some applications, the upper surface of the plug protrudes above an interlevel dielectric layer 618, creating a step. The height of the step, for example, is about 5–100 nm. Providing a plug without the step is also useful.

The plug is, for example, coupled to a diffusion region of a transistor of the memory cell. The gate of the transistor is coupled to a wordline and the other diffusion region is coupled to the bitline. The top electrode is coupled to, for example, a plateline. For series architecture, the top electrode is coupled to the other diffusion region. Coupling the top electrode to a reference voltage, such as $V_{DD}/2$ is also useful, particularly for DRAM applications.

To prevent oxidation of the plug, a barrier stack 690 is located between the lower electrode and the plug. An adhesion layer 649 is provided between the plug and barrier stack to promote adhesion of the barrier layer to the interlevel dielectric layer. The adhesion layer can be formed from, for example, titanium (Ti), tantalum (Ta), titanium nitride/titanium (TiN/Ti), tantalum nitride/tantalum (TaN/Ta), tantalum nitride/titanium (TaN/Ti) or other adhesion promoting materials. In applications where the plug comprises polysilicon, a silicide pre-layer, such as titanium silicide (TiSi), is used to reduce or minimize contact resistance between the plug and adhesion layer. The adhesion layer can also serve to reduce or minimize diffusion of silicon (Si) from the plug into the barrier layer. Typically, the adhesion layer is about 1–20 nm thick while the barrier layer is about 1–100 nm thick. Other layer thicknesses are also useful.

In accordance with one embodiment of the invention, the barrier stack comprises at least first and second barrier layers 648 and 668. The barrier layers are, in one embodiment, conductive, creating a conductive barrier stack to electrically couple the lower electrode to the plug. In one embodiment, the first barrier layer comprises iridium (Ir). Other types of barrier material, such as ruthenium (Ru), rhodium (Rh), palladium (Pd) hafnium (Hf) or a combination or alloys thereof, are also useful. The first barrier layer is disposed below the second barrier layer. The thickness of the first barrier layer is about 10 nm–1 $\mu$m.

The second barrier layer comprises a conductive oxide. In one embodiment, the conductive oxide comprises iridium oxide ($IrO_2$). Conductive oxides formed from other types of conductive barrier materials are also useful. For example, oxides of conductive barrier materials, such as Ru, Rh, Pd, Hf or a combination or alloys thereof, can be used. The conductive oxide is formed by, for example, sputtering, PVD, CVD, CSD, spin-on, or hydro-thermal synthesis techniques. Other techniques for forming the conductive oxide are also useful. The thickness of the second barrier layer is typically about 5 nm to 1 $\mu$m.

In accordance with another embodiment of the invention, the first layer of the barrier stack comprises at least first and second sub-barrier layers 648a–b. The sub-barrier layers, for example, comprise iridium (Ir). Other types of barrier materials, such as ruthenium (Ru), rhodium (Rh), palladium (Pd), hafnium (Hf) or alloys thereof, are also useful. The different sub-barrier layers can be formed from either the same or different materials. Preferably, the first and second sub-barrier layers comprise the same material. More preferably, the sub-barrier layers comprise Ir.

The grain boundaries 623 and 621 of the sub-barrier layers, in one embodiment, are mismatched (e.g., not aligned). By mismatching the grain boundaries, the interface 647 between the different sub-barrier layers serve to block the diffusion path of elements, such as $O_2$, thus improving the barrier properties of the barrier stack. The grain boundaries of the second sub-barrier layer and second barrier layer can also be mismatched to further improve the barrier properties of the barrier stack.

In one embodiment, the grain boundaries at or near the surface of the first sub-barrier layer are passivated (e.g., stuffed). In one embodiment, elements larger than the grain boundaries are used to passivate the grain boundaries at or near the surface of a barrier layer. Such elements block the grain boundaries, eliminating the diffusion path to the plug. In one embodiment, the grain boundaries are passivated with $O_2$. Other elements may also be used to passivate the grain boundaries. Various techniques, such as an anneal in an oxidizing ambient, can be used to passivate the grain boundaries. Oxidizing ambient includes, for example, $O_2$, ozone ($O_3$) or $NO_{x(0<x<2)}$. Other techniques for passivating the grain boundaries, which include forming a thin oxide layer over the barrier layer, are also useful. The thin oxide layer can be formed by, for example, thermal oxidation. Other techniques can also be used. By passivating the grain boundaries, the diffusion of $O_2$ is further inhibited.

In a preferred embodiment, the grain boundaries are passivated using a rapid thermal oxidation (RTO) process. The RTO also forms a thin oxide layer on the surface of the barrier layer. The thin oxide layer advantageously promotes mismatching of the grain boundaries between the first and second layer. In another preferred embodiment, the grain boundaries at or near the surface of the second barrier layer are also passivated with $O_2$ to further improve the barrier properties of the barrier stack.

Additional sub-barrier layers can be included in the first barrier layer. The grain boundaries of adjacent barrier layers are preferably mismatched. In one embodiment, at least the grain boundaries of the bottom barrier layer are passivated at or near its surface. Preferably, the grain boundaries of some or all the barrier layers are passivated at or near their surfaces. Using multiple sub-barrier layers with mismatched boundaries improves the barrier properties of the stack, advantageously enabling the use of thinner barrier stack or layer without sacrificing reliability.

Figure 7:
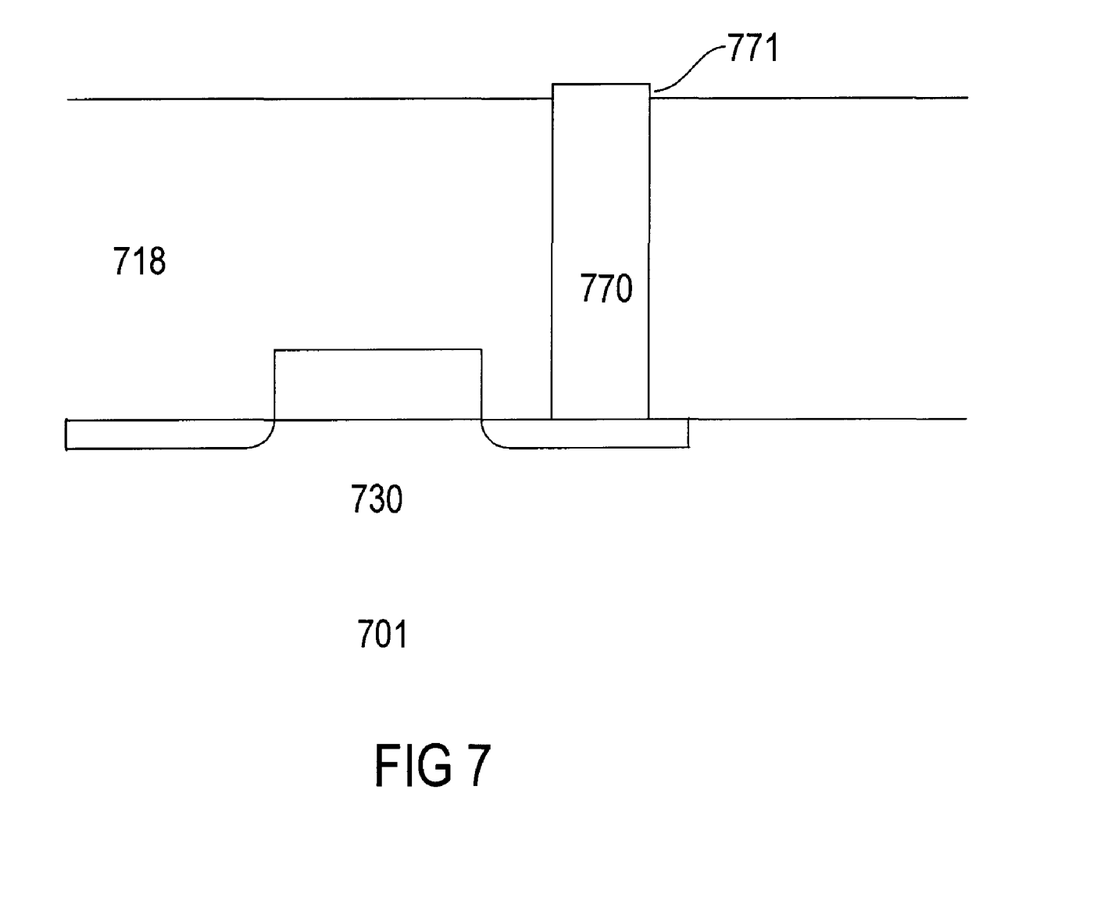
FIGS. 7–10 show a process for fabricating a capacitor over plug in accordance with one embodiment of the invention.
Figure 8:
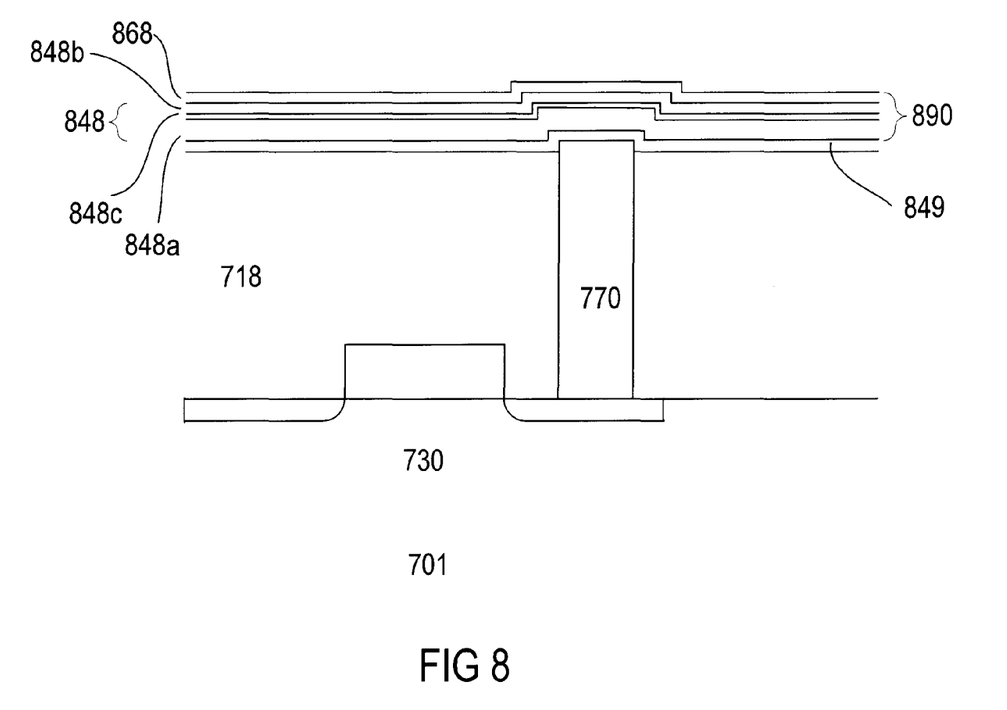
Figure 9:
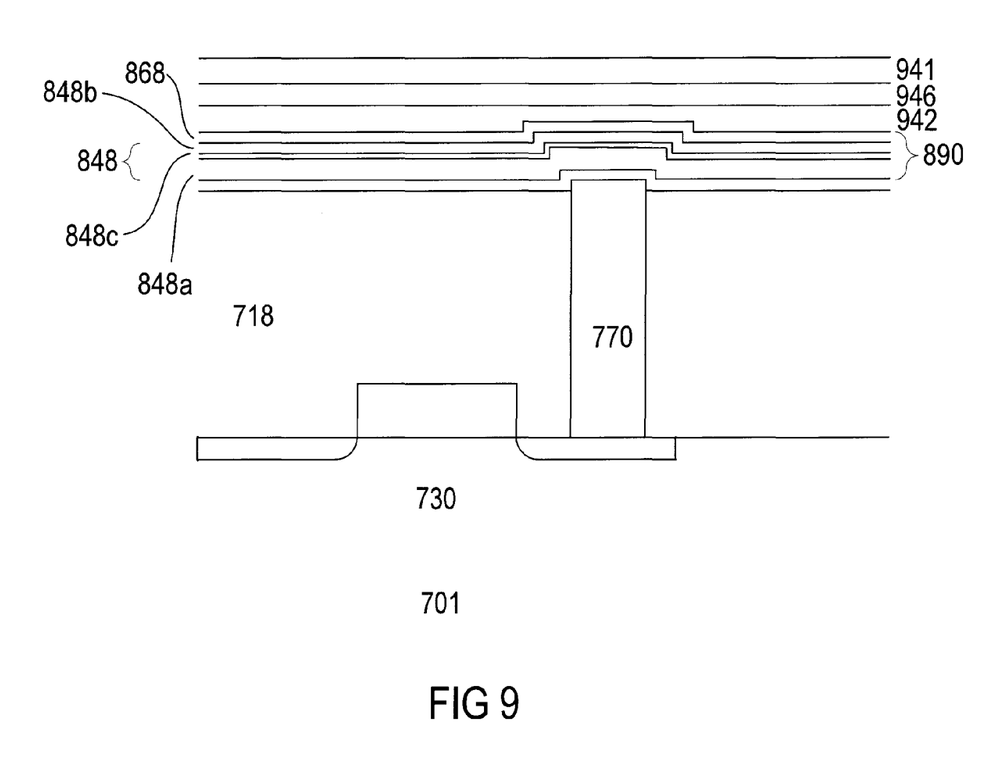

Referring to FIGS. 7–9, a process for fabricating the barrier stack in accordance with one embodiment is shown. The barrier stack is employed, for example, to reduce or prevent oxidation of a plug in a capacitor over plug structure of a memory cell. As shown, a substrate 701 is shown. The substrate comprises a semiconductor substrate such as silicon. Other types of substrate, such as silicon on insulator, can also be used. The substrate is prepared with an ILD 718 formed thereon. The ILD, for example, comprises $SiO_2$. Other types of dielectric materials, such as silicon nitride (SiN), are also useful. A plug 770, which for example is coupled to a diffusion region of a transistor 730, is formed in the ILD. The plug can be formed from tungsten or poly-Si. Other types of conductive materials are also useful. Various known deposition and patterning techniques can be used to provide the prepared substrate. In one embodiment, a top surface of the plug is above the surface of the ILD layer, creating a step 771. Alternatively, the top surface of the plug can be co-planar or below the surface of the ILD layer.

Referring to FIG. 8, an adhesion layer 849 is deposited over the dielectric layer. The adhesion layer comprises, for example, titanium (Ti). Other types of adhesion layers, such as tantalum (Ta) or titanium nitride/titanium (TiN/Ti), tantalum nitride/tantalum (TaN/Ta), tantalum nitride/titanium (TaN/Ti), or other adhesion promoting materials can also be used. The adhesion layer is deposited by conventional techniques. Such techniques include, for example, DC sputtering or chemical vapor deposition (CVD). If the plug comprises poly-Si, a pre-layer comprising silicide is formed on the ILD prior to the adhesion layer. he silicide layer can be formed by, for example, annealing of sputtered metal on poly-Si.

The process continues to form the layers of the barrier stack 890. In one embodiment, the process continues to form first and second barrier layers 848 and 868. In one embodiment, the first barrier layer comprises a conductive material which serves as a barrier for elements, such as $O_2$. Conductive barrier materials which serves as a barrier to other elements are also useful. In one embodiment, the first barrier layer comprises Ir. Alloys of Ir are also useful. Other types of barrier layer, such as Ru, Rh, Pd, Hf or alloys thereof, can also be used. Various known techniques, including chemical vapor deposition (CVD), chemical solution deposition (CSD), electro-plating, hydro-thermal synthesis or physical vapor deposition (PVD) can be used to form the barrier layer.

In one embodiment, the second barrier layer comprises a conductive oxide. Preferably, the second barrier layer enhances the barrier properties of the first barrier layer. In one embodiment, the second barrier layer comprises $IrO_2$. Other conductive oxides, such as oxides of Ru, Rh, Pd or a combination thereof, are also useful. In one embodiment, the conductive oxide is formed by reactive-sputtering using oxygen gas. Other techniques such as PVD, CVD, electro-plating, spin-on or hydro-thermal synthesis are also useful.

In accordance with another embodiment of the invention, the first barrier layer comprises first and second sub-barrier layers 848a–b. The sub-barrier layers comprise, for example, Ir. Other types of materials which can serve as a barrier to elements, such as $O_2$, are also useful. For example, Ru, Rh, Pd, alloys or a combination thereof, can be used to form the first sub-barrier layer. It is understood that the first and second sub-barrier layers need not be formed from the same material.

In one embodiment, the grain boundaries of the first and second sub-barrier layers are deposited on the substrate such that the grain boundaries of the sub-barrier layers are mismatched. The sub-barrier layers are formed by various techniques. Such techniques, for example, in include PVD, CVD, electro-plating, spin-on and hydro-thermal synthesis. Other techniques are also useful.

In one embodiment, the grain boundaries at or near the surface of a first sub-barrier layer are passivated. Preferably, the grain boundaries are passivated with elements larger than the grain boundaries are used to passivate the grain boundaries to block them as diffusion paths to the plug. More preferably, the grain boundaries are passivated with $O_2$. Other elements may also be used to passivate the grain boundaries. In one embodiment, an anneal in an oxidizing ambient is performed after the formation of the first sub-barrier layer to passivate its grain boundaries. Oxidizing ambient includes, for example, $O_2$, ozone ($O_3$) or $NO_{x(0<x<2)}$. Preferably, the first sub-barrier layer is passivated using an RTO process. The RTO, for example, is performed at a temperature of 400–700° C. for about 5–600 sec. Other techniques, such as thermal oxidation, for passivating the grain boundaries are also useful.

In one embodiment, mismatch in grain growth can be facilitated by depositing a thin conductive layer 848c over the first sub-barrier layer which is of a different material. The conductive layer, for example, comprises a conductive oxide. Alternatively, using different first and second sub-barrier layers are also useful. In yet another embodiment, different process parameters can be used to deposit the first and second sub-barrier layers to promote different grain growth (e.g., different grain sizes).

In another embodiment, after the second sub-barrier is formed, an anneal in an oxidizing ambient is performed. Preferably, the anneal comprises an RTO in an oxidizing ambient. The anneal forms an oxide layer over the second sub-barrier layer as well as stuffing the grain boundaries near the surface of the second sub-barrier layer.

Referring to FIG. 9, the process continues to form the capacitor on the barrier stack. In one embodiment, the process continues to form a ferroelectric capacitor. Forming other types of capacitors are also useful. The process includes sequentially forming first conductive electrode layer 941, ferroelectric layer 946, and second electrode layer 942. The electrode, for example, comprises a noble metal. Other types of conductive materials can also be used. In one embodiment, the ferroelectric material comprises PZT. Other types of ferroelectric materials, such as SBT, are also useful. Various known techniques are can be used to form the different layers of the capacitor. Such techniques, for example, include CVD, chemical solution deposition (CSD), electroplating, hydro-thermal synthesis, or physical vapor deposition (PVD).

Figure 10:
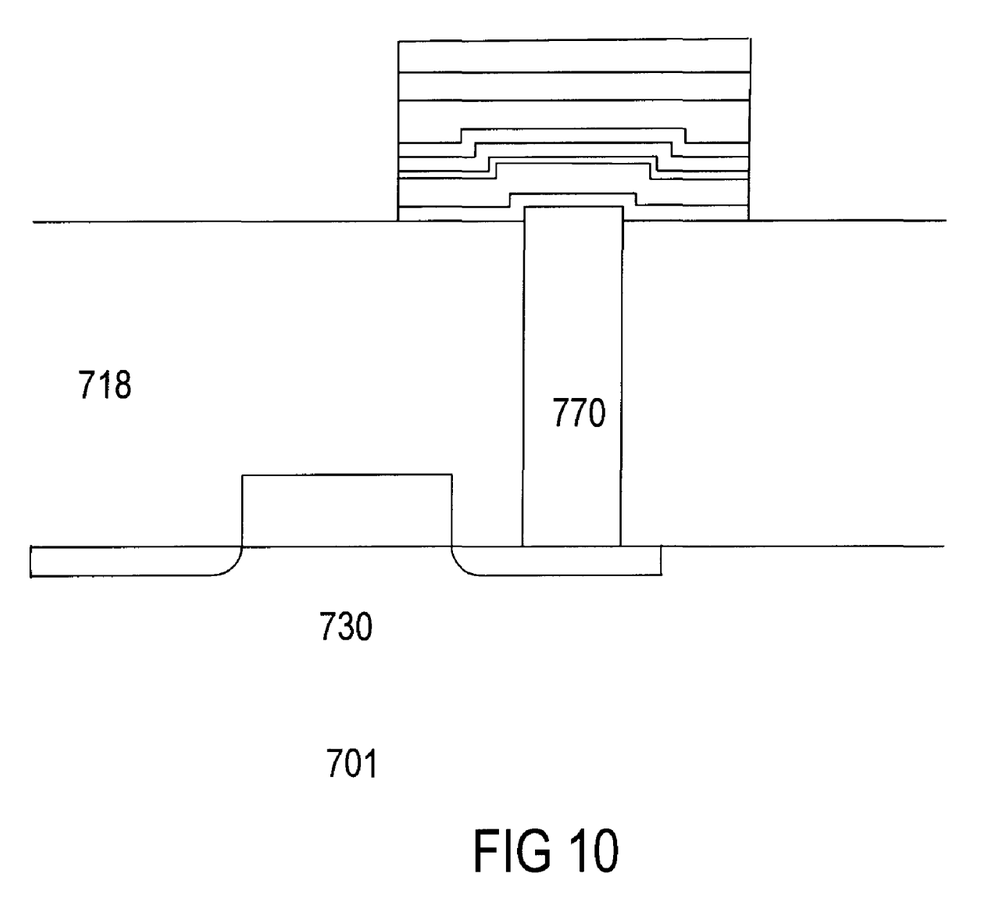

As shown in FIG. 10, the various layers on the ILD are patterned to form the capacitor over plug structure. The layers are patterned using, for example, conventional mask and etch techniques. Alternatively, the various capacitor layers can be patterned in multiple processes. For example, ferroelectric layer and top electrode can be patterned first, followed by patterning of the bottom electrode, barrier stack, and adhesion layer. Such two step processes are useful for forming capacitor pairs, such as those used in series architectures. Also, the bottom electrode layer and layers beneath can be first patterned followed by deposition and patterning of other layers of the capacitor. Other techniques for forming the capacitor are also useful.

In one embodiment, the substrate is annealed after the capacitor is formed. The anneal is performed in an oxygen ambient to recover the electrical characteristics of the capacitor. The anneal, for example, is performed at a temperature of about 500–800° C. for about 1 minute to 5 hours. During the anneal, oxygen diffuses through the layers of the capacitor. However, the barrier stack prevents or reduces the diffusion of oxygen to the plug, improving plug reliability.

Experiments

Figure 11:
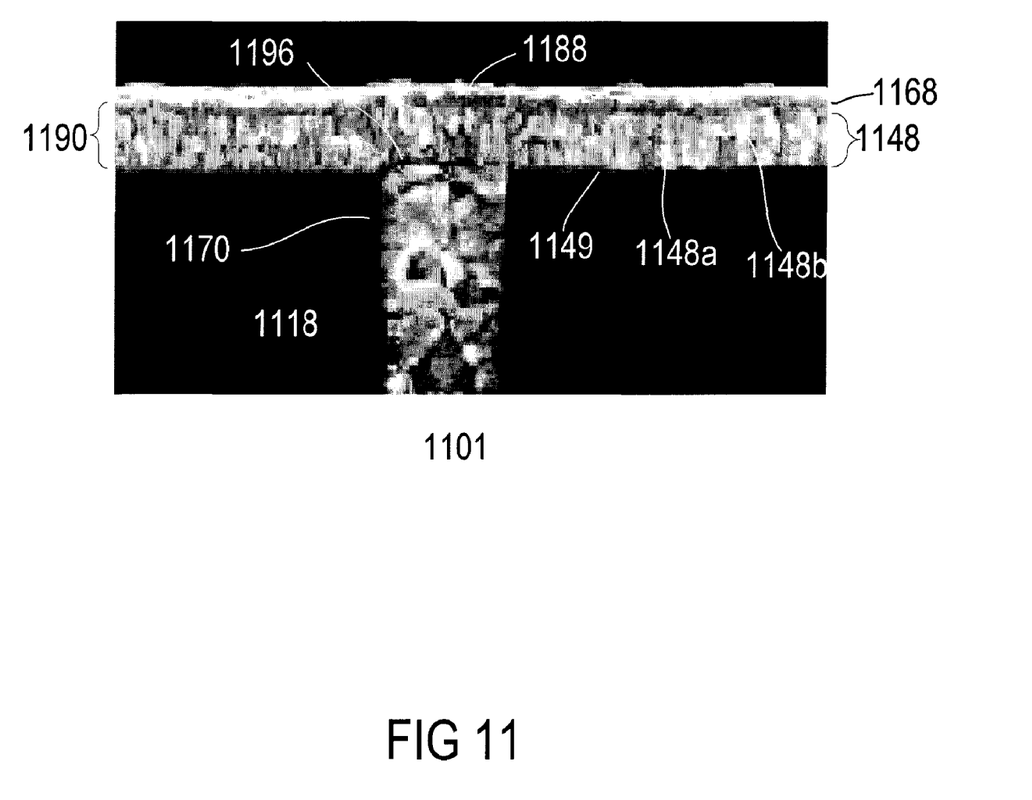
FIG. 11 shows a TEM of an experiment conducted on a barrier stack formed in accordance with one embodiment of the invention.

FIG. 11 shows a TEM of COP test structure 1101 which includes a barrier stack formed in accordance with different embodiments of the invention. The test structures include a polysilicon plug 1170 formed in a $SiO_2$ ILD layer 1118. The plug includes a 30 nm step above the ILD layer. A 10 nm thick titanium layer 1149 is sputter deposited over the plug. The titanium layer serves as an adhesion layer, promoting adhesion between the ILD and a barrier stack 1190.

The barrier stack includes first and second barrier layers 1148 and 1168. The first barrier layer comprises first and second sub-barrier layers 1148a–b. The sub-barrier layers each comprises about 60 nm thick Ir deposited by sputtering. After the first sub-barrier layer is formed, an RTO is performed followed by deposition of the second sub-barrier layer. An RTO is also performed after the second sub-barrier layer is deposited. The second barrier is formed over the first barrier layer. The second barrier layer comprises a 50 nm thick $IrO_2$ layer formed by reactive sputtering technique using oxygen gas. Above the barrier stack is a 10 nm thick platinum layer 1188.

The structure was subjected to an anneal in $O_2$ at 650° C. for about 2 hours. As can be seen from the TEM, the barrier stack was effective in reducing or preventing plug oxidation, evidenced by the relatively clean interface line 1196 between the barrier and plug as well as the consistent texture of the plug.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A barrier stack comprising:
   a first sub-barrier layer, the first sub-barrier layer comprises a first sub-barrier conductive barrier material, the first sub-barrier layer includes grain boundaries;
   a second sub-barrier layer disposed above the first sub-barrier layer, the second sub-barrier layer comprises a second sub-barrier conductive barrier material, the second sub-barrier layer includes grain boundaries; and
   passivating elements are provided to passivate grain boundaries on an upper surface of the first sub-barrier layer.

2. The barrier stack of claim 1 serves as a barrier for capacitor over plug structure of a memory cell.

3. The barrier stack of claim 2 wherein the capacitor over plug structure includes a plug having a step over an ILD layer.

4. The barrier stack of claim 1 serves as a barrier for capacitor over plug structure of a plurality of memory cells arranged in a series architecture.

5. The barrier stack of claim 4 wherein the capacitor over plug structure includes a plug having a step over an ILD layer.

6. The barrier stack of claim 1 serves as a barrier for capacitor over plug structure of a ferroelectric memory cell.

7. The barrier stack of claim 6 wherein the capacitor over plug structure includes a plug having a step over an ILD layer.

8. The barrier stack of claim 1 serves as a barrier for capacitor over plug structure of a plurality of ferroelectric memory cells arranged in a series architecture.

9. The barrier stack of claim 8 wherein the capacitor over plug structure includes a plug having a step over an ILD layer.

10. The barrier stack of claim 1 wherein the passivating elements comprises oxygen.

11. The barrier stack of claim 10 wherein:
    the first sub-barrier material comprises Ir, Ru, Rh, Pd, Hf or a combination thereof; and
    the second sub-barrier material comprises Ir, Ru, Rb, Pd, Hf a conductive oxide or a combination thereof.

12. The barrier stack of claim 11 wherein the grain boundaries of the first and second sub-barrier layers are mismatched.

13. The barrier stack of claim 11 wherein the grain boundaries of the first and second sub-barrier layers are mismatched.

14. The barrier stack of claim 1 wherein:
    the first sub-barrier material comprises Ir, Ru, Rh, Pd, Hf or a combination thereof; and
    the second sub-barrier material comprises Ir, Ru, Rh, Pd, Hf a conductive oxide or a combination thereof.

15. The barrier stack of claim 14 wherein the grain boundaries of the first and second sub-barrier layers are mismatched.

16. The barrier stack of claim 1 wherein the grain boundaries of the first and second sub-barrier layers are mismatched.

17. The barrier stack of claim 14 wherein the passivating elements comprises a size greater than the grain boundaries of the first sub-barrier layer.

18. The barrier stack of claim 17 wherein:
    the first sub-barrier material comprises Ir, Ru, Rh, Pd, Hf or a combination thereof; and
    the second sub-barrier material comprises Ir, Ru, Rh, Pd, Hf, a conductive oxide or a combination thereof.

19. The barrier stack of claim 18 wherein the grain boundaries of the first and second sub-barrier layers are mismatched.

20. The barrier stack of claim 17 wherein the grain boundaries of the first and second sub-barrier layers are mismatched.

21. The barrier stack of claim 1 further comprises an upper barrier layer disposed above the second sub-barrier layer, the upper barrier layer comprises a conductive oxide.

22. The barrier stack of claim 21 wherein the passivating elements comprises a size greater than the grain boundaries of the first sub-barrier layer.

23. The barrier stack of claim 21 wherein the passivating elements comprises oxygen.

24. The barrier stack of claim 21 wherein:
the first sub-barrier material comprises Ir, Ru, Rh, Pd, Hf or a combination thereof; and
the second sub-barrier material comprises Ir, Ru, Rh, Pd, Hf, a conductive oxide or a combination thereof.

25. The barrier stack of claim 21 wherein the grain boundaries of the first and second sub-barrier layers are mismatched.

26. The barrier stack of claim 21 wherein the grain boundaries of the upper barrier and second sub-barrier layers are mismatched.

27. A barrier stack comprising:
a first sub-barrier layer, the first sub-barrier layer comprises a first sub-barrier conductive barrier material, the first sub-barrier layer includes grain boundaries;
a second sub-barrier layer disposed above the first sub-barrier layer, the second sub-barrier layer comprises a second sub-barrier conductive barrier material, the second sub-barrier layer includes grain boundaries; and
passivating elements are provided to passivate grain boundaries on an upper surface of the first sub-barrier layer, wherein the passivating elements comprises a size greater than the grain boundaries of the first sub-barrier layer.

28. A barrier stack comprising:
a first sub-barrier layer, the first sub-barrier layer comprises a first sub-barrier conductive barrier material, the first sub-barrier layer includes grain boundaries;
a second sub-barrier layer disposed above the first sub-barrier layer, the second sub-barrier layer comprises a second sub-barrier conductive barrier material, the second sub-barrier layer includes grain boundaries;
wherein grain boundaries of the first and second sub-barrier layers are mismatched; and
passivating elements are provided to passivate grain boundaries on an upper surface of the first sub-barrier layer.

* * * * *